(12) United States Patent
Bewlay et al.

(10) Patent No.: US 6,210,478 B1
(45) Date of Patent: Apr. 3, 2001

(54) REFINING AND ANALYSIS OF MATERIAL USING HORIZONTAL COLD-CRUCIBLE INDUCTION LEVITATION MELTING

(75) Inventors: Bernard Patrick Bewlay, Schenectady; Don Mark Lipkin, Niskayuna; Dennis Joseph Dalpe, Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/346,133

(22) Filed: Jul. 9, 1999

(51) Int. Cl.[7] .................................................. C30B 13/22
(52) U.S. Cl. .............................. 117/37; 117/46; 117/50; 117/51; 117/52
(58) Field of Search .............................. 117/37, 46, 50, 117/51, 52

(56) References Cited

U.S. PATENT DOCUMENTS 2,875,108 * 2/1959 Pfann ..................................... 117/43
3,702,368  11/1972 Hukin .
4,273,608 * 6/1981 Kerlin ..................................... 117/46

FOREIGN PATENT DOCUMENTS 2207061  1/1989 (GB) .

* cited by examiner

Primary Examiner—Felisa Hiteshew
(74) Attorney, Agent, or Firm—Noreen C. Johnson; Douglas E. Stoner

(57) ABSTRACT

A method and apparatus for locally and successively melting a material by induction heating using a horizontal floating-zone crucible to refine and/or analyze the material. An electromagnetic field is generated to create a localized molten zone within the material that is at least partially levitated within the crucible. The crucible has an upper peripheral opening so that an upper portion of the molten zone is generally at a higher temperature than the lower portion of the molten zone adjacent the crucible wall. As a result, insoluble inclusions within the material separate and float to the upper portion of the molten zone. The molten zone may be translated longitudinally through the material to drive the inclusions toward one end of the material. The process can be carried out to refine or characterize the material, or to determine the solidus and liquidus temperatures of the material.

19 Claims, 2 Drawing Sheets

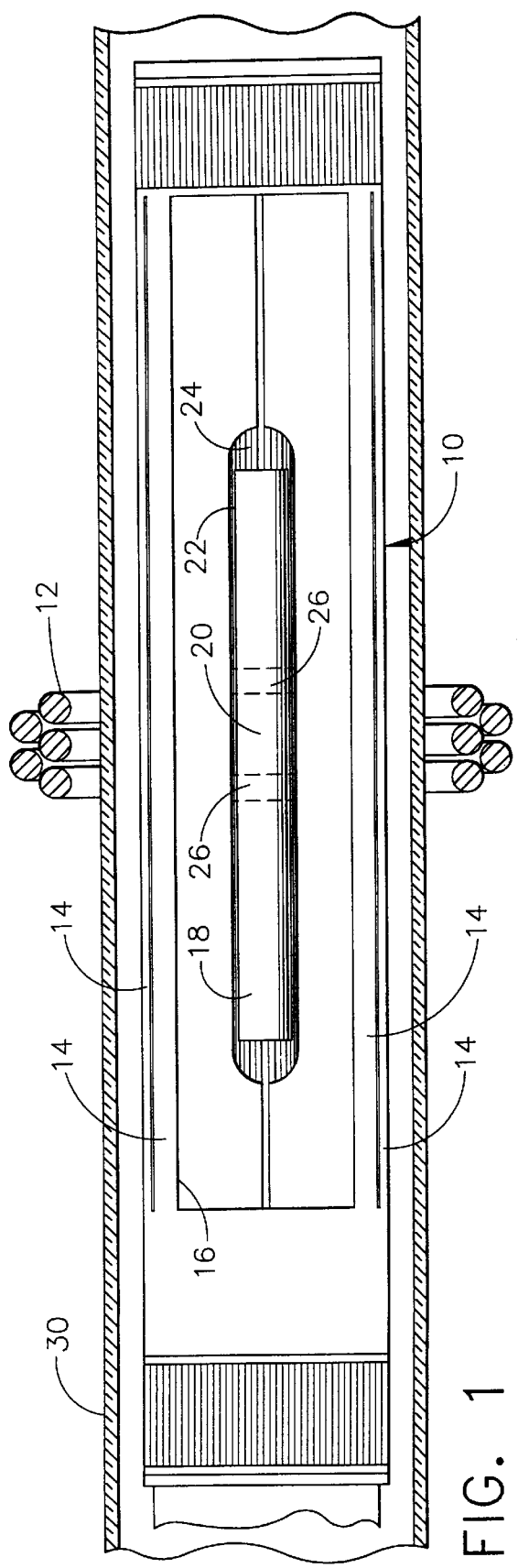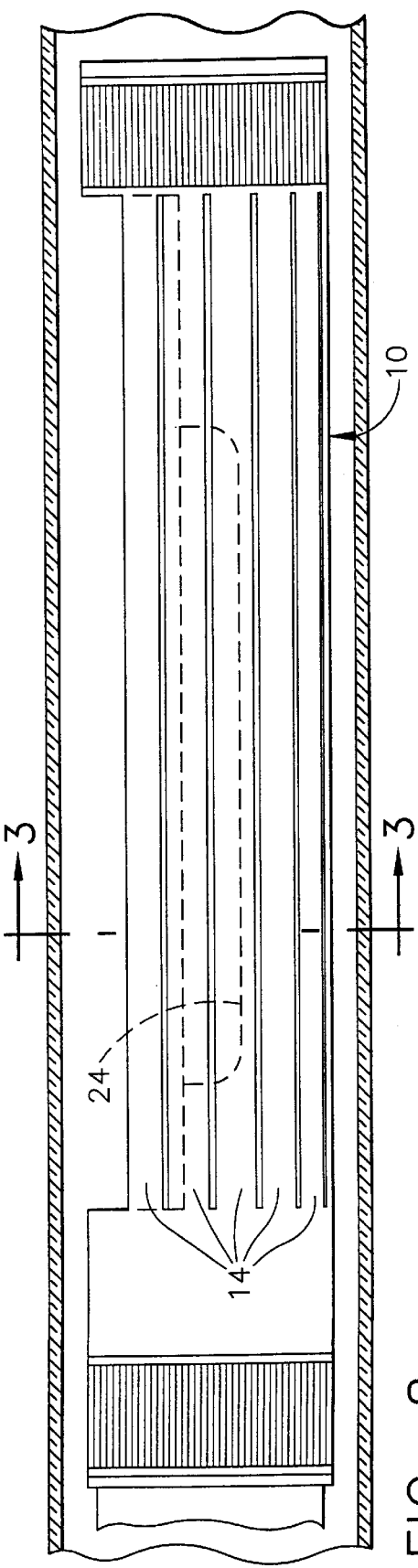
FIG. 1
FIG. 2

REFINING AND ANALYSIS OF MATERIAL USING HORIZONTAL COLD-CRUCIBLE INDUCTION LEVITATION MELTING

BACKGROUND OF THE INVENTION

This invention relates to cold-crucible induction melting techniques and apparatuses therefor. More particularly, this invention is directed to the use of a horizontal floating-zone cold crucible for at least levitating and locally melting a material by induction heating to refine and/or analyze the material, and particularly for the purpose of removing insoluble inclusions while leaving desired alloying constituents in tact.

Vertical cold-crucible induction levitation melting techniques are known, an example of which is U.S. Pat. No. 3,702,368 to Hukin. With such techniques, a material is placed in a vertically-oriented metal crucible, melted and then slightly levitated out of contact with the crucible by a radio frequency field generated by an induction coil surrounding the crucible. The walls of the crucible are water-cooled and segmented, the latter of which enables induction heating to occur through the metal crucible walls by interrupting induced current flow in the walls that would otherwise attenuate the induction coil field.

Melting by induction levitation has also been used to purify materials such as silicon (e.g., UK Patent Application 2207061) and high-temperature reactive metals such as titanium, niobium and chromium and their alloys by a process known as floating-zone refining. The chemical reactivity of titanium, niobium and chromium can degrade conventional oxide crucibles as a result of a high negative free energy of the reactive metal oxide formation. While melting and casting operations can be performed in an inert atmosphere or vacuum to avoid reactions with gaseous oxygen and nitrogen, oxygen and nitrogen are generally nonetheless available either in the form of impurities in the processing environment or from the crucible. Significant degradation of the crucible and contamination of a reactive melt becomes more likely as the melting temperature of the alloy and the concentration of reactive elements in the alloy increase. For these reasons, floating-zone refining has been used to purify reactive materials, during which a molten zone is traversed from one end of the material to the other, where elemental impurities become concentrated as a result of solubility differences of the impurities between the liquid and solid phases of the material.

Zone refining can be categorized as either horizontal floating-zone or vertical floating-zone, depending on the orientation of the material and the direction in which the molten zone moves during refining. In both techniques, the material is completely surrounded by the crucible walls in order to contain and achieve a substantially uniform temperature in the molten zone. While horizontal and vertical floating-zone refining techniques have been developed to produce very pure ingots of high-temperature elemental materials that contain soluble elemental impurities, they have not been successfully employed for removing minimal solubility inclusions from alloys. Inclusions of interest include oxides, carbides, nitrides, silicides, carbonitrides, oxynitrides and oxycarbides, which occur in alloys such as nickel-based and cobalt-based superalloys and titanium alloys. Accordingly, it would be desirable if a technique were available for enabling zone refining of high-temperature alloys, including alloys containing reactive elements, for the purpose of removing insoluble inclusions from an alloy but not its desired alloying constituents. It would also be desirable if such a technique employed an improved crucible design that enabled additional processes to be carried out on the alloy being refined.

SUMMARY OF THE INVENTION

According to the present invention, there is provided a method for locally and successively melting regions of an alloy by induction heating using a horizontal floating-zone crucible to refine and/or analyze the alloy. The invention is particularly directed to the removal of insoluble inclusions from high-temperature reactive metals and their alloys, nickel-based and cobalt-based superalloys, and other materials containing reactive elements. As used herein, reactive elements will be understood to mean those elements that readily react with or dissolve species within the processing environment, including crucibles and molds, such as silicon, aluminum, calcium, oxygen, nitrogen, carbon and magnesium.

The method of this invention generally entails the use of a crucible having a chamber with horizontally and oppositely-disposed first and second ends, and having means for generating an electromagnetic field within the chamber. A material is then placed within the chamber, and an electromagnetic field is generated to fully or at least partially levitate the material within the container and to create a localized molten zone within the material, preferably starting at or near one end of the material. The localized molten zone is then translated horizontally through the material in a direction toward an oppositely-disposed second end of the material adjacent the second chamber end, progressively melting successive local regions of the material. Each successive region first melts and then resolidifies as the localized molten zone traverses it.

According to one aspect of the invention, the material is zone refined in a manner that causes physical separation of insoluble inclusions within the molten material as a result of the inclusions having lower densities than the molten material. The inclusions float to the top of the localized molten zone, and are driven toward the one end of the material as the molten zone is translated along the material. This process has been shown to be particularly useful for removing low-density solid inclusions, such as oxides, carbides, nitrides, silicides, carbonitrides, oxynitrides, oxycarbides and mixtures thereof from reactive metals and alloys containing reactive elements. To promote refining, the horizontal chamber of the crucible preferably has a longitudinal opening located within its upper circumferential region, which causes a transverse temperature gradient to exist between the surface of the material facing the crucible wall and the surface of the material facing the opening, with that portion of the material facing the opening being hotter. According to this invention, inclusions have been found to be driven to and become concentrated at the surface of the material facing the opening.

According to another aspect of the invention, the process can be used to determine the solidus and liquidus temperatures of a non-congruent melting alloy by visual and pyrometric inspection of the alloy during melting and resolidification. For this purpose, the longitudinal opening noted above allows for optical (e.g., visual and pyrometric) inspection of the alloy as it is heated through its solidus and liquidus temperatures, which correspond to the extremes of a visible mushy zone of the alloy. By enabling both visual and pyrometric inspection, the locations of the mushy zone extremes can be visually ascertained and the solidus and liquidus temperatures corresponding to these extremes can be measured.

In view of the above, it can be seen that a significant advantage of this invention is that an alloy containing highly reactive but intentionally added alloying constituents can be purified and/or analyzed using a crucible that has a horizontally-oriented melt chamber, as opposed to vertical chambers used by the prior art for these materials. Unlike vertical floating-zone techniques that rely only on surface tension to stabilize the melt within the floating zone, the horizontal floating-zone technique of this invention also makes use of the electromagnetic field to support and stabilize the molten region. Because of the typically elongated sample geometry, there is less of a tendency for distortion or break-up of the melt during processing in accordance with this invention.

Other objects and advantages of this invention will be better appreciated from the following detailed description.

BRIEF DESCRIPTION OF THE DRAWINGS

FIGS. 1, 2 and 3 are top, side and end views of a horizontal floating-zone crucible and induction heating coil for use in the method of this invention.

DETAILED DESCRIPTION OF THE INVENTION

The present invention is generally directed to methods for refining and analyzing materials by causing a localized molten zone to traverse the material. The present invention is particularly useful for refining and analyzing materials having high melting temperatures, e.g., above 1200° C., and to reactive materials that are difficult to melt without adverse reactions with oxide-based crucibles and impurities in the processing atmosphere, both of which produce contaminants in the melt.

Figure 3:
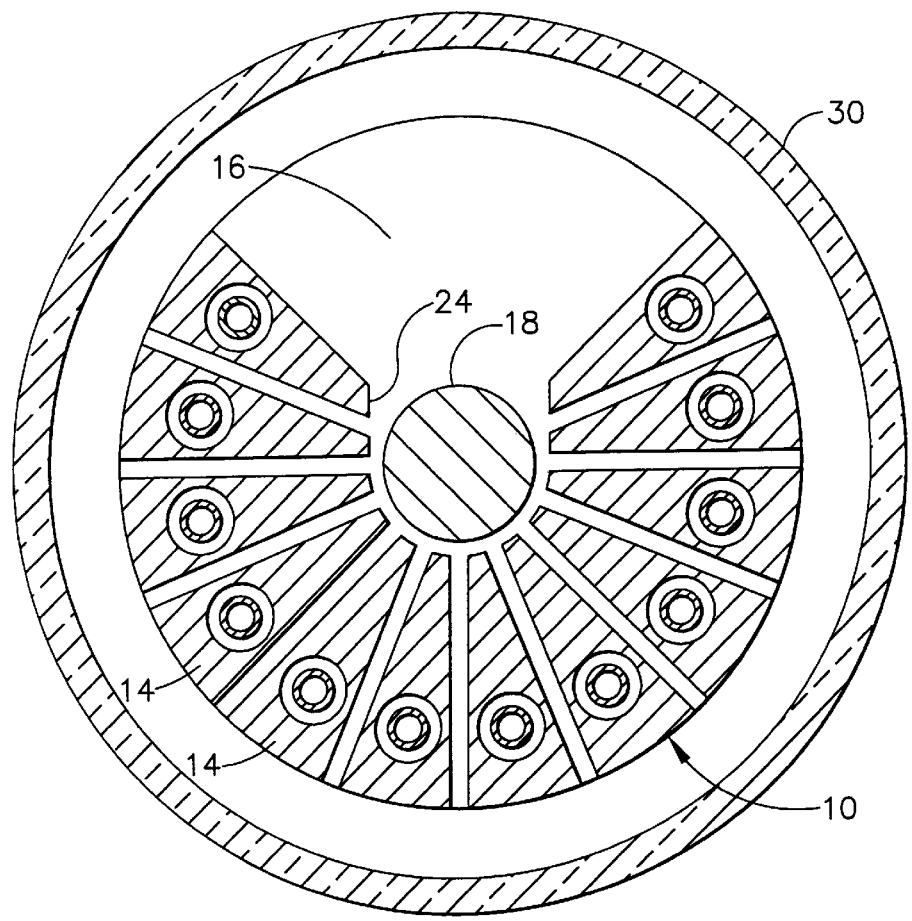

A preferred apparatus for carrying out the method of this invention is commercially available from Crystalox, and schematically represented in FIGS. 1 through 3. The apparatus is shown as including a horizontal crucible 10, which is shown in FIG. 1 as being coaxially surrounded by an induction heating coil 12. Shown in phantom in FIG. 1 is a quartz tube 30 in which the crucible 10 is housed, which allows processing to occur within a vacuum or inert atmosphere. Other suitable materials for the tube 30 are possible and within the scope of this invention. The crucible 10 is preferably a cold-wall (e.g., water-cooled) copper crucible with multiple longitudinal segments 14 that provide the crucible 10 with a generally cylindrical outer shape and define a chamber 24 within the crucible 10. As shown in FIG. 1, the crucible 10 has a horizontal longitudinal opening 16 located within an upper section of the crucible 10. A starting material 18 is represented in FIG. 1 as being contained within the crucible 10.

The coil 12 is operated to generate an electromagnetic field that locally melts the material 18 by induction heating. The coil 12 is adapted to be translated along the sample material 18 during operation of the apparatus, so that a localized molten zone 20 traverses the length of the material 18. For this purpose, the crucible 10 can be transported through the coil 12, the coil 12 can be moved along the length of the crucible 10, or a combination of both. The coil 12 is operated at a power level sufficient to cause the generated electromagnetic field to melt and at least partially levitate the material 18 as depicted in the Figures, i.e., the molten material 18 has minimal contact with the crucible 10.

A suitable frequency range for generating an adequate electromagnetic field within the crucible 10 is about 0.5 kHz to about 1000 kHz, depending on the size and electrical properties of the material 18. Under these operating conditions, the coil 12 creates the localized molten zone 20 in the material 18, as indicated in FIG. 1. The localized molten zone 20 can be relatively narrow, typically having an axial length approximately equal to the diameter of the material 18.

According to this invention, inclusions have been shown to be driven to the surface of the material 18 facing the opening 16 in the crucible 10. Insoluble contaminants and inclusions within the material 18 that are less dense than the base alloy of the material 18 are believed to be separated and driven (floated) toward the upper surface of the molten zone 20 by buoyancy forces. Another feature of this invention is the likely existence within the molten zone 20 of a radial temperature gradient. The gradient is believed to arise due to the crucible configuration and assist in driving inclusions axially through the material 18. In practice, sizing the opening 16 to constitute about 90° (25%) of the circumference of the crucible 10 (i.e., about 270° of the crucible circumference enclosed by the segments 14) has been shown to be suitable, though it is foreseeable that the opening 16 could account for a much smaller or greater proportion of the circumference, up to about 180° (50%).

Figure 4:
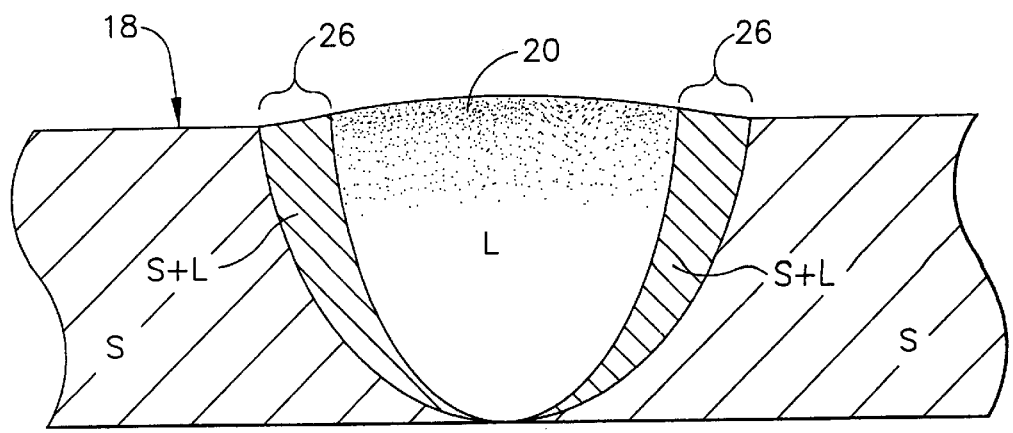
FIG. 4 shows the delineation of a localized molten zone and mushy zone in an alloy processed with the crucible of FIGS. 1 through 3.

For refinement, the localized molten zone 20 is preferably translated horizontally through the material 18 by translating the crucible 10 and coil 12 relative to each other, e.g., moving the coil 12 toward the right end of the crucible 10 in FIG. 1. Importantly, movement of the localized molten zone 20 through the material 18 is regulated to occur at a rate that achieves the particular objective of the process. For removing inclusions from the material 18, a rate of about 0.1 to about 100 mm/minute is preferred to allow insoluble contaminants and solid inclusions within the material 18 to separate and float to the surface of the molten zone 20. The contaminants and inclusions are then observed to be driven toward the opposite (trailing) end 22 of the material 18, probably due to the shape of the surface of the interface between the molten zone 20 and surrounding solid material, as depicted in FIG. 4. As a result, the contaminants and inclusions can be removed to yield a refined material 18, as well as to allow analysis of the contaminants and inclusions.

For determination of the solidus and liquidus temperatures of the material 18, the molten zone 20 is not required to move through the material 18, though it can be translated at a rate of up to about one mm/minute to allow for optical observation and clear physical delineation of the mushy zone 26 (FIG. 4), the length of which corresponds to the alloy melting range and the temperature gradient in the material 18. The solidus and liquidus temperatures can be determined via the longitudinal opening 16 by such methods as optical pyrometry. Determination of the solidus and liquidus temperatures is important for large-scale melting and casting of commercial and developmental alloys because these temperatures have a strong influence on alloy castability and defect generation, which in turn can limit the size and quality of ingots that can be cast.

During an investigation that led to this invention, a charge of about 70 grams of a nickel alloy was placed in a crucible similar to that shown in FIGS. 1 through 3. The alloy, which contained various insoluble inclusions, was processed by first traversing the initial charge, and then the subsequent specimen, with a molten zone generated by an induction coil, again similar to that depicted in FIG. 1. The crucible had twelve water-cooled segments around approximately three-quarters (i.e., 270°) of its circumference. The remaining quarter of the circumference (i.e., 90°) was open to form a longitudinal opening for optical and physical access to the alloy within. The crucible had an internal diameter of about 12.5 mm, an outside diameter of about 50 mm, and a length of about 150 mm. The crucible was housed within a quartz tube that was evacuated to a vacuum of about $10^{-6}$ Torr. The crucible was then backfilled with an atmosphere of high-purity flowing argon prior to melting the nickel alloy charge. The induction coil was a double-wound, four-turn copper coil having an outside diameter of about 10 mm. The coil was connected to a 350 kHz generator operating at about 45 kW, which was found to be sufficient to partially levitate the charge and create a localized molten zone of about 12 mm in the longitudinal direction of the alloy. Starting at one end of the charge, the coil was translated at a rate of about 6 mm/minute over the crucible. Afterwards, inclusions within the alloy were found to be concentrated at the opposite end of the alloy.

From this experiment, it was concluded that a horizontal induction levitation melting technique could be used to successfully refine a high-temperature alloy. It was also apparent that a range of translation rates would be acceptable, and that the translation rate could be varied over the length of the specimen.

While the invention has been described in terms of a preferred embodiment, other forms could be adopted by one skilled in the art. Accordingly, the scope of the invention is to be limited only by the following claims.

What is claimed is:

1. A method comprising the steps of:
   providing a crucible having a peripheral wall that defines a horizontal chamber with horizontally and oppositely-disposed first and second ends;
   placing a material within the chamber and generating an electromagnetic field that at least partially levitates at least a portion of the material within the chamber; and
   creating a localized molten zone within the material that causes insoluble inclusions within the material to separate and float to a surface of the localized molten zone without separating alloying constituents within the material.

2. A method as recited in claim 1, wherein a radial temperature gradient within the localized molten zone is caused by an opening along an upper peripheral portion of the crucible between the first and second ends thereof, and the insoluble inclusions separate and float toward an upper region of the localized molten zone.

3. A method as recited in claim 2, wherein the opening constitutes up to about 180° of a cross-sectional perimeter of the crucible.

4. A method as recited in claim 1, further comprising the step of moving the localized molten zone through the material so as to progressively melt successive regions of the material in a direction toward one end of the material, each successive region resolidifying as the localized molten zone traverses it, so as to cause the insoluble inclusions to be driven to the one end of the material.

5. A method as recited in claim 4, wherein the step of moving the localized molten zone entails translating the electromagnetic field from the first end to the second end of the chamber.

6. A method as recited in claim 4, further comprising the step of removing the one end of the material with the insoluble inclusions.

7. A method as recited in claim 6, wherein the removing step serves to refine the material.

8. A method as recited in claim 6, further comprising the step of analyzing the one end of the material for inclusion content.

9. A method as recited in claim 1, wherein the material contains at least one reactive element.

10. A method as recited in claim 1, wherein the material is a reactive metal or a metal alloy containing at least one reactive element.

11. A method as recited in claim 1, wherein the crucible is a water-cooled segmented crucible, and wherein an induction coil surrounds the crucible and generates the electromagnetic field.

12. A method as recited in claim 1, wherein the material is a metal alloy, the method further comprising the step of detecting the solidus and liquidus temperatures of the material based on a temperature gradient within the localized molten zone and the location of mushy zone fronts within the localized molten zone.

13. A method for refining a metal alloy containing insoluble inclusions and at least one alloying constituent, the method comprising the steps of:
   providing a horizontal segmented crucible having a peripheral wall that defines a horizontal chamber with horizontally and oppositely-disposed first and second ends, the crucible further having a longitudinal opening along an upper peripheral portion of the crucible between the first and second ends, the opening constituting up to about 180° of the cross-sectional perimeter of the crucible;
   placing the alloy within the chamber and generating an electromagnetic field to at least partially levitate at least a portion of the alloy within the chamber;
   creating a localized molten zone within the alloy near the first end of the chamber, an upper portion of the localized molten zone being adjacent the longitudinal opening and at a higher temperature than a lower portion of the localized molten zone adjacent the peripheral wall of the crucible, the insoluble inclusions separating and floating to the upper portion of the localized molten zone; and then
   translating the localized molten zone horizontally in a direction toward one end of the alloy so as to progressively melt successive local regions of the alloy, each successive local region resolidifying as it leaves the localized molten zone so as to cause the insoluble inclusions to be driven to the one end of the alloy.

14. A method as recited in claim 13, wherein the alloy is chosen from the group consisting of reactive metal alloys and alloys containing at least one reactive element.

15. A method as recited in claim 13, wherein the insoluble inclusions comprise at least one material chosen from the group consisting of oxides, carbides, nitrides, silicides, carbonitrides, oxynitrides and oxycarbides.

16. A method as recited in claim 13, wherein the moving step entails transporting an induction coil from the first end to the second end of the chamber.

17. A method for determining the solidus and liquidus temperatures of a metal alloy, the method comprising the steps of:
   providing a horizontal segmented crucible having a peripheral wall that defines a horizontal chamber with horizontally and oppositely-disposed first and second ends, the crucible further having an opening along an upper peripheral portion of the crucible between the first and second ends;

placing the alloy within the chamber and generating an electromagnetic field to at least partially levitate at least a portion of the alloy within the chamber;

creating a localized molten zone within the alloy, an upper portion of the localized molten zone being adjacent the opening so that a radial temperature gradient exists within the localized molten zone; and then detecting temperatures across the localized molten zone and a mushy zone within the localized molten zone so as to determine the solidus and liquidus temperatures of the alloy.

18. A method as recited in claim 17, wherein the alloy contains at least one reactive element.

19. A method as recited in claim 17, wherein the detecting step entails a visual and pyrometric inspection through the opening in the peripheral portion of the crucible.

* * * * *